United States Patent [19]
Hsiao

[11] Patent Number: 6,040,585
[45] Date of Patent: Mar. 21, 2000

[54] METHOD FOR DETECTING WAFER ORIENTATION DURING TRANSPORT

[75] Inventor: Yi Li Hsiao, Ta-Lin, Taiwan

[73] Assignee: Taiwan Semiconductor Manufacturing Co., Ltd, Hsin-chu, Taiwan

[21] Appl. No.: 09/379,134

[22] Filed: Aug. 20, 1999

[51] Int. Cl.[7] .......................... G01N 21/86; C23C 16/00; G01B 11/14; B65G 25/00; B65G 49/07
[52] U.S. Cl. ...................... 250/559.4; 118/719; 356/375; 414/217; 414/936
[58] Field of Search .................................... 356/375, 400; 414/217, 161, 936; 355/53; 250/559.4; 118/719

[56] References Cited

U.S. PATENT DOCUMENTS 5,466,945  11/1995  Brickell et al. ..................... 250/559.12
5,690,744  11/1997  Landau ..................................... 118/715
5,882,165   3/1999  Maydan et al. .......................... 414/217

Primary Examiner—Frank G. Font
Assistant Examiner—Armando Rodriguez
Attorney, Agent, or Firm—Tung & Associates

[57] ABSTRACT

The orientation of a wafer carried on a blade of a semiconductor wafer transfer system is sensed in order to prevent wafer damage during transfer of the wafer from chamber-to-chamber within a semiconductor processing system. At least a pair of laser beams are used to sense both tilt of the wafer on the blade, and mis-alignment of the blade in the chamber. A control and logic circuit lock out movement of the blade when the laser beams indicate tilt of the wafer or mis-alignment of the blade.

20 Claims, 7 Drawing Sheets

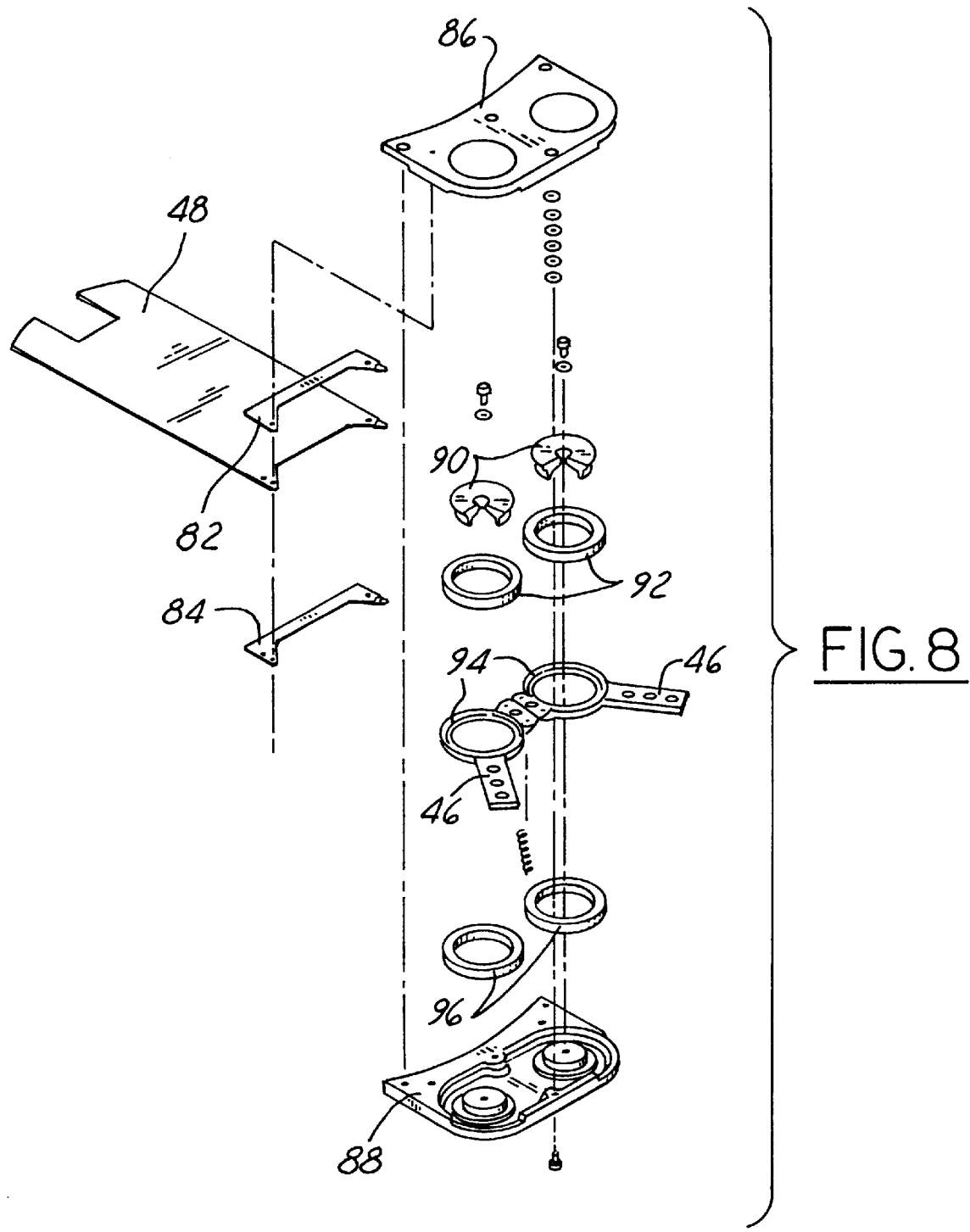

METHOD FOR DETECTING WAFER ORIENTATION DURING TRANSPORT

TECHNICAL FIELD

The present invention generally relates to a method for transferring wafers in a semiconductor manufacturing process, and deals more particularly with a method for monitoring and controlling the proper positioning of the wafers during a wafer transfer sequence.

BACKGROUND OF THE INVENTION

The need for increasing yield and throughput in semiconductor manufacturing systems has resulted in the development of highly specialized and automated systems for processing and handling semiconductor wafers. Wafers are typically stored in a cassette with their flat surfaces horizontal. The cassettes are transferred from station-to-station by automatic material handling equipment. Once delivered to at a process station, individual wafers are transferred from the cassette by an automatically controlled robot that typically includes a robotic arm carrying a wafer supporting blade on its outer end. The blade is moved in a manner to pick up individual wafers such that the wafer lays flat on the blade during the transfer process. This arrangement has the advantage that a wafer is held on the end of the robotic arm through the force of gravity, thus avoiding the application of unnecessary or unbalanced forces to the wafer that could result in damage to the wafer.

Wafer processing systems of the type referred to above typically include one or more so called "cluster tools" consisting of a modular, multi-chambered, integrated processing system having a central wafer handling module, and a number of peripheral process chambers. Cluster tools have become generally accepted as effective and efficient equipment for manufacturing advanced microelectronic devices. Wafers are introduced into a cluster tool where they undergo a series of processing steps sequentially in various circumferentially arranged chambers wherein wafer transfer is effected through the robotic wafer handling module which is located in the central region of the system. The wafer handling module includes a robotic wafer transfer arm which is positioned on a turntable that rotates through 360 degrees, thus permitting the arm to transfer wafers sequentially from chamber-to-chamber.

In spite of the fact that the robotic arm for transferring the wafers is automatically controlled, slight misadjustments, errors caused by wear or software "glitches" can result in problems in the wafer transfer process. For example, in some cases, misalignment of certain components in the system, such as the blade, robotic arm or the cassette can result in a wafer being loaded onto a blade such that the wafer is tilted relative to the blade, i.e. not horizontal on the blade. In other cases, although the wafer may be supported flat on the blade, the blade itself may be tilted after it lifts a wafer from the cassette. In still other cases where the rotational position of the robotic arm relative to a cassette is not precisely indexed or where the blade is tilted out of its normal horizontal position, attempts to fetch a wafer from the cassette may result in the robotic arm or the blade colliding with slit door insert of the load lock chambers which in turn damages or breaks the wafer. Even where the robotic succeeds in lifting a wafer from the cassette, alignment errors in the transfer process can result in collisions between process chamber pedestal, slit door, lower parts of chamber and the wafer during loading, unloading or transfer of the wafers.

The problem described above involving wafer damage due to errors in the transfer process have become more significant as the size of the wafers continues to increase, along with advances in wafer processing technology. This type of wafer damage reduces throughput and process yield, and is becoming more costly due to the larger size of the wafers.

The present invention is directed toward overcoming the deficiencies of the prior art wafer transfer systems described above.

SUMMARY OF THE INVENTION

According to one aspect of the invention, a method is provided for controlling the operation of a semiconductor wafer transfer robot by using an apparatus including a moveable robotic arm, a wafer blade for holding the wafer and a means for driving the arm. The apparatus also includes means for sensing proper positioning of the wafer on the blade and control means for controlling the motor means which is responsive to the sensing means for stopping movement of the arm when a wafer is not properly positioned on the blade. The sensing means preferably includes a pair of lasers positioned to produce a corresponding pair of laser beams that pass across and are closely spaced from the surface of the wafer, along with a pair of laser beam sensors for respectively sensing the beams, wherein at least one of the laser beams is blocked when a wafer is not properly positioned on the blade. The control means includes logic means that allow movement of the robotic arm only when both laser beam sensors indicate that the wafer is properly positioned on them blade. The sensing means also includes means for sensing the position of the robotic arm to ensure that it is properly positioned to load and unload the wafers.

According to another aspect of the invention, a method is provided for transferring a semiconductor wafer between a plurality of chambers in a semiconductor processing system by using an apparatus comprising robotic arm means shiftable between a retracted home position and extended wafer transfer position; a blade disposed on the outer end of the arm upon which one of the wafers may be placed; means for rotating the robotic arm means between a plurality of indexed positions respectively corresponding to the locations of the chambers; drive means for driving the arm means to rotate between the indexed positions and to shift between the retracted and extended positions thereof; means for sensing when the wafer is properly positioned on the blade and when the arm means is properly positioned at one of the indexed positions thereof; and control means coupled with the sensing means and the drive means for controlling the operation of the drive means.

According to a further aspect of the invention, a method is provided for controlling the operation of a semiconductor wafer transfer system of the type having a blade on which a wafer is carried, a robotic arm for transferring the blade between a plurality of chambers in a semiconductor processing system, which includes the steps of: rotating the arm between each of a plurality of indexed positions, each corresponding to one of the chambers; shifting the arm between an extended, wafer transferring position, and a retracted, home position; sensing when the semiconductor is not in a pre-selected, desired position on the blade; and, inhibiting rotation and shifting of the arm when the wafer is not in the pre-selected position thereof.

Accordingly, it is the primary object of the present invention to provide a method detecting proper orientation of a semiconductor wafer and a wafer transfer system which reduces damage to wafers due to collisions.

Another object of the invention is to provide a method as described above which increases wafer throughput and yield, while simultaneously reducing down time of the equipment resulting from wafer damage or equipment collisions.

A still further object of the invention is to provide a method as mentioned above which utilizes a positive interlock feature that inhibits movement of a wafer transferring robotic arm if either a wafer is not preferably positioned on the end of the arm, or the arm, and its components are not properly aligned or registered with other components in the processing system.

Another object of the invention is to provide a method as mentioned above which utilizes a minimum number of components and which can be easily retrofitted to existing wafer transfer equipment.

These, and further objects and advantages of the present invention will be made clear or will become apparent during the course of the following description of a preferred embodiment of the invention.

BRIEF DESCRIPTION OF THE DRAWINGS

In the drawings, which form an integral part of the specification, and are to be read in conjunction therewith, and in which like components are used to designate identical components in the various views:

FIG. 8 is an exploded, perspective view of the outer end of the robotic arm and wafer carrying blade; and, FIG. 9 is a block diagram of the controller and associated components for controlling the operation of the wafer transfer system.

DETAILED DESCRIPTION OF THE PREFERRED EMBODIMENT

Figure 1:
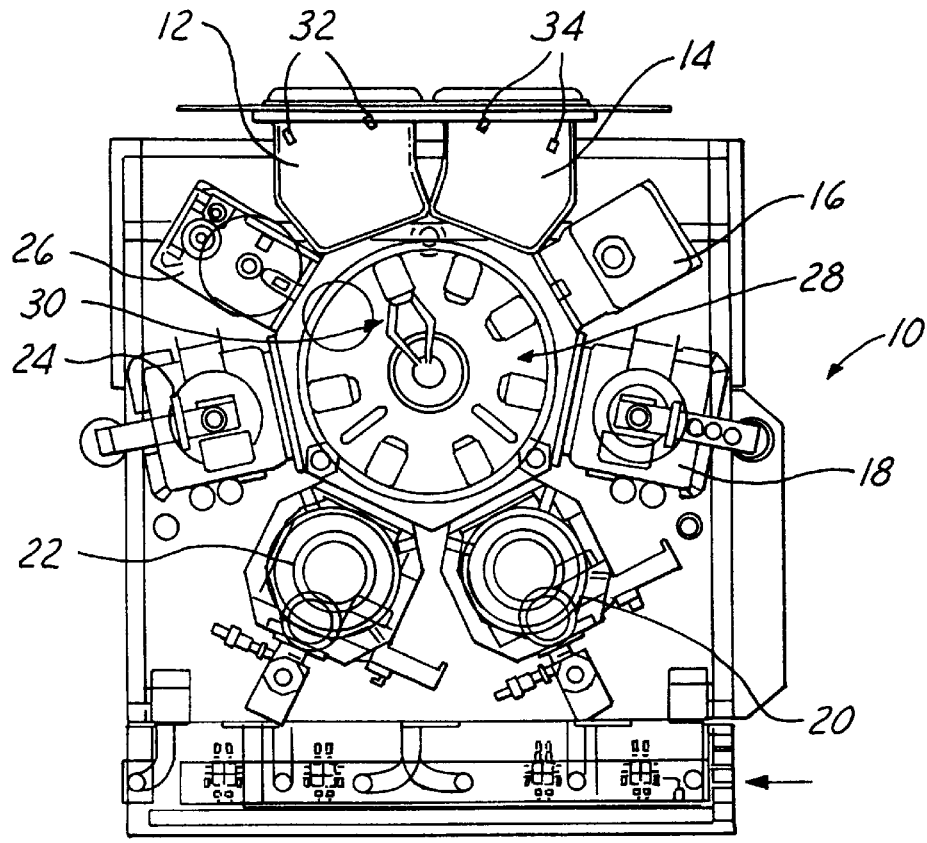
FIG. 1 is a plan view of a cluster tool used to process semiconductor wafers.

Referring now to the drawings, the present invention relates to a method for detecting the proper orientation of a semiconductor wafer 36 being processed in a semiconductor wafer processing system, such as the cluster tool, generally indicated by the numeral 10 in FIG. 1. The cluster tool 10 includes a plurality of processing chambers 16, 18, 20. 22, 24, 26 circumferentially arranged around an automatically controlled, wafer transfer unit, generally indicated by the numeral 30. Also arranged around the periphery of the transfer unit 30 is a pair of adjacent load lock chambers 12, 14 each of which is adapted to receive and hold a cassette 34 within which a plurality of the wafers 36 are held in horizontal, stacked relationship to each other. Typically, the cassettes 34 are transferred into and away from the load lock chamber 12, 14 by means of a dedicated cassette transfer system (not shown) wherein the cassettes are transferred from station-to-station in pods.

The wafer transfer unit 30, which will be described in detail below, transfers individual wafers from a cassette 34 in one of the load lock chambers, for example load lock chamber 14, sequentially between the processing stations 16–26. Each of the processing stations 16–26 is dedicated to performing a particular process such as etching, stripping, or deposition (PVD or CVD). The chambers 16–26 each include an opening provided with a closure permitting the transfer unit 30 to transfer a wafer 36 into the chamber, following which the chamber is closed to provide an air tight processing environment. The components and mechanical features of the cluster tool 10 are tightly compacted to reduce space requirements and transfer distances, consequently the path of transfer of the wafer 36 through the cluster tool is critical. Misalignment, misadjustment or other errors in wafer transfer processes can result in the edges of the wafer 36 coming into contact with structural components of the cluster tool 10, thus resulting in damage to the wafer 36. As will become apparent below, the present invention is capable of detecting proper orientation of a wafer and controlling the wafer transfer unit 30 in a manner to prevent such collisions.

Figure 5:
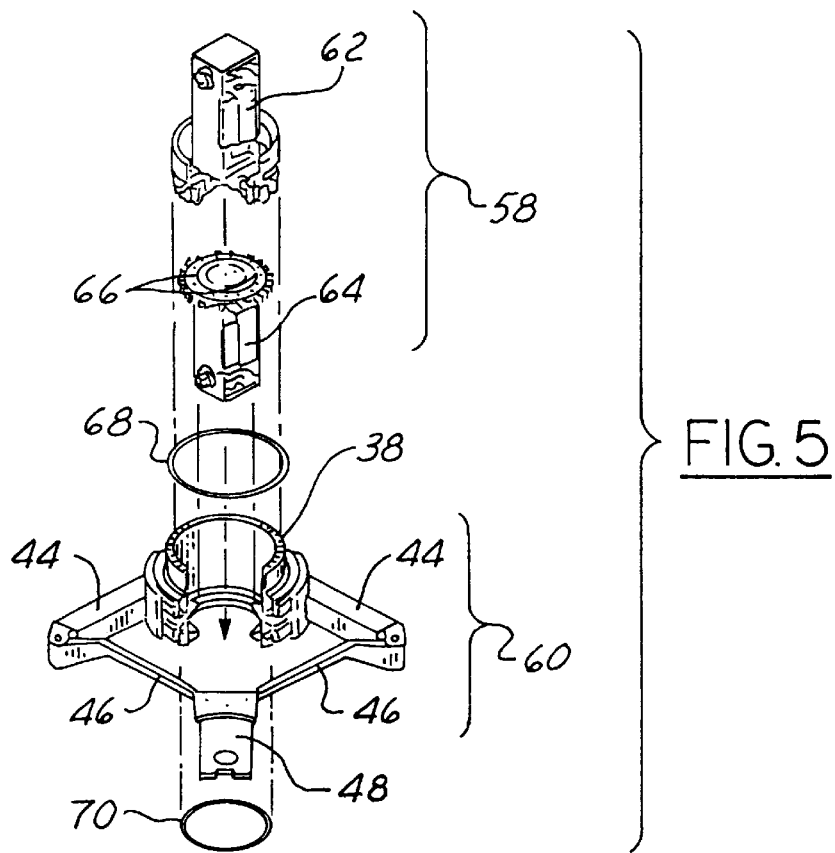
FIG. 5 is an exploded, perspective view of the robotic arm and its associated drive mechanism.
Figure 6:
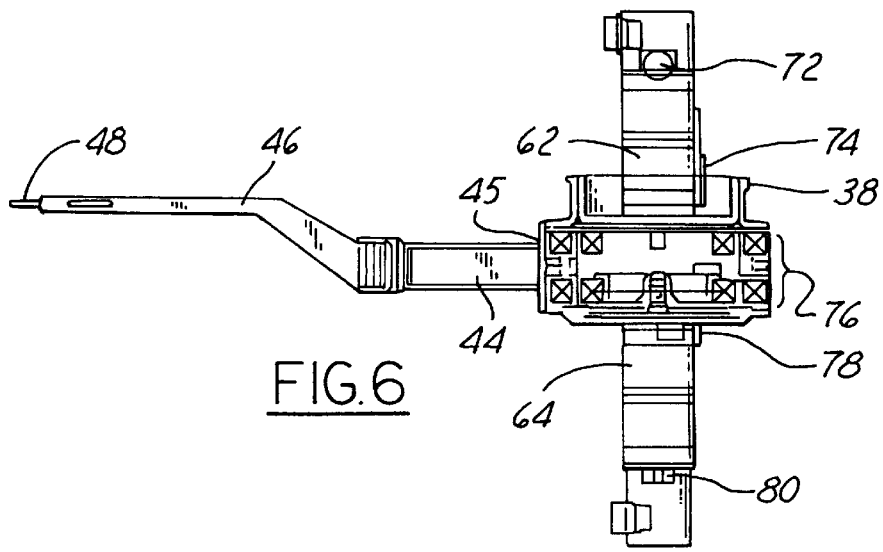
FIG. 6 is a side view, partially in section of the robotic arm and drive mechanism.

The wafer transfer unit 30 includes robotic arm means comprising a pair of wings 44 rotatable about a vertical axis, and a pair of corresponding robotic outer arms 46 hingedly connected to the wings 44 at pivot points 50. The robotic arm means is housed within a buffer chamber 28 defined by a housing internal to the cluster tool 10. The robotic arm components discussed above form part of a robotic arm assembly 60 (FIG. 5) which is driven by drive assemblies 58 that include an upper drive assembly 62, and a lower drive assembly 64. The upper drive assembly 62 includes an upper stepper motor 40, an upper stepper encoder 72 and an upper home position sensor 74. Similarly, lower drive assembly 64 includes a lower stepper motor 42, a lower step encoder 80 and a lower home position sensor 78, all of which components are generally axially arranged and positioned beneath the robotic arm assembly 60. The upper and lower drive assembly 62, 64 are sealed by O-rings 68, 70 and housed within a generally cylindrical robotic tube 38. Hard stops 66 may be provided on either the upper or lower drive assemblies 62, 64 to limit the rotational movement of the drives.

Each of the wings 44 includes a flange 45 secured to a corresponding ring 47. The rings 47 are journaled for independent rotation about the outer periphery of the tube 38, and are respectively driven by the upper and lower drive assemblies 62. 64, via upper and lower vacuum magnet assemblies 76.

Figure 7A:
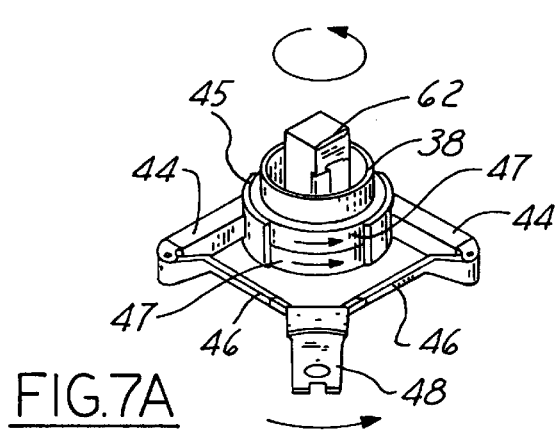
FIGS. 7A–7D are perspective views of the robotic arm, respectively depicting sequential operating positions thereof.
Figure 7B:
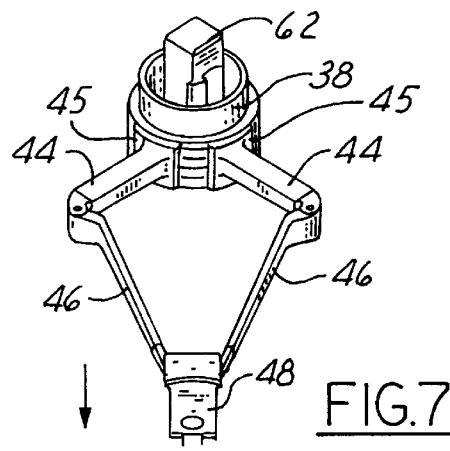

As seen in FIG. 7A, when the drive assembly 62, 64 drives both of the rings 47 in a clockwise direction (as viewed in plan), rings 44 likewise rotate in a clockwise direction to move the blade (and any wafers 36 supported thereon) in an arc, as during transfer of a wafer 36 between the chambers 12–26. In FIG. 7B, the arm assembly 60 may be extended (as is required during loading or unloading of a wafer 36) by driving the upper and lower drives 62, 64 in opposite rotational directions. Specifically, the upper ring 47 is rotated in a clockwise direction while the lower ring 47 is simultaneously rotated in a counterclockwise direction. This opposite driving relationship causes wings 44 to rotate toward each other, in turn causing arms 46 to rotate about the pivot points 50, all of which action results in the blade 48 moving radially outward.

Figure 7C:
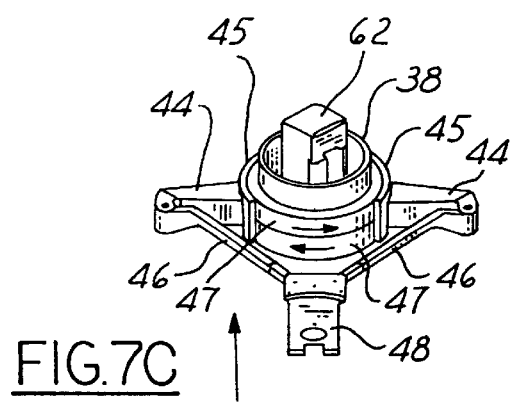
Figure 7D:
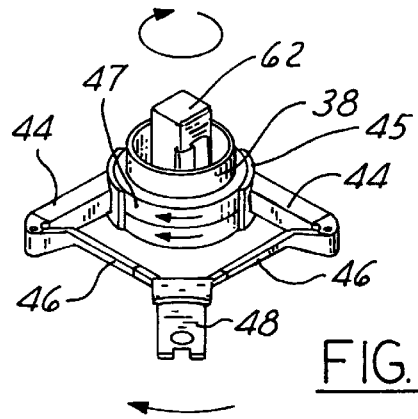

As shown in FIG. 7C, the blade 48 is retracted by driving the rings 47 in directions opposite of that shown in FIG. 7B, i.e. the upper ring 47 is rotated in a counterclockwise direction and the lower ring 47 is rotated in the opposite direction. This action causes wings 44 to rotate away from each other, thus retracting arms 46 and the blade 48. Finally, the blade 48 may be rotated in a counterclockwise direction simply by driving the upper and lower rings 47 in a clockwise direction.

FIG. 8 depicts the details of the outer ends of arms 46 and the structure employed to connect the blade 48 on the arms 46. The outer ends of the arms 46 are provided with a pair of interconnected rings 94. The blade 48 is secured to the rings 94 by means of an upper and lower clamps 86, 88 between which the blade 48 is sandwiched. Two sets of bearings 92, 96 along with retainer assemblies 90 facilitate rotation of the rings 94 within the lower and upper clamps 86, 88. One end of the blade 48 is sandwiched between a pair of Kapton pads 82, 84 which in turn are held between lower and upper clamps 86, 88 by means of screws or other suitable fasteners.

Figure 2:
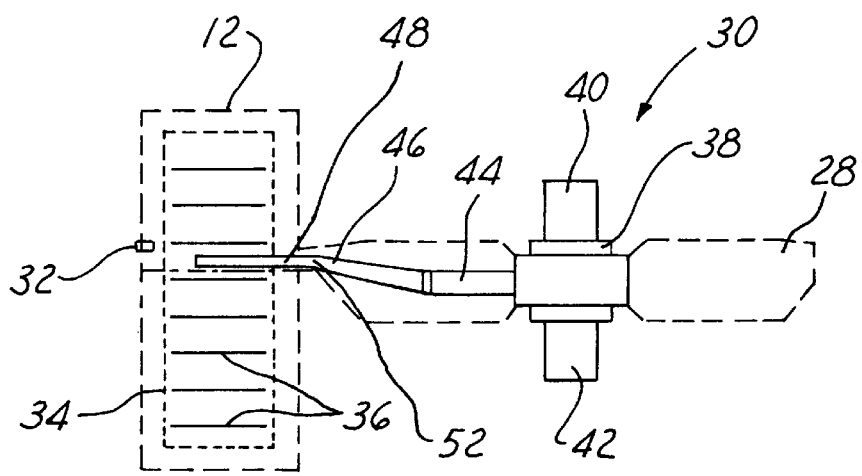
FIG. 2 is a diagrammatic, elevational view shoring the relationship of the robotic arm to a wafer carrying cassette.
Figure 3:
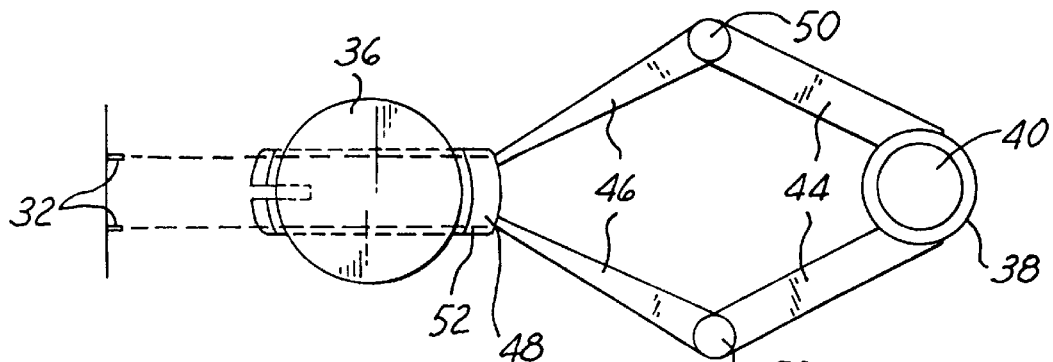
FIG. 3 is a plan view of the cassette and robotic arm shown in FIG. 2.

In order to sense whether the blade 48 and wafer 36 are properly oriented, sensing means is provided in the form of a pair of lasers 52 mounted on the top side of the blade 48, as best seen in FIGS. 2 and 3. Each of the lasers 52 includes a head delivering a continuous, narrow laser beam of, for example, less than 0.5 mm in diameter. The heads of the lasers 52 are oriented to direct a pair of laterally spaced beams radiating outwardly in close proximity to the bottom side of the blade 48. If desired, however, the heads of the lasers 52 may be mounted on the top side of the blade 48 and positioned immediately above the upper surface of the wafer 36 so that the beams are directed across and immediately above the surface of the wafer 36. In any event, at least certain of the chambers 12–26 have mounted therein a pair of spaced apart laser sensors, two pairs of which, designated by the numerals 32 and 34 are shown in a load lock chambers 12, 14. As shown in FIGS. 2 and 3, the sensors 32 are mounted on the inside surface of the outer wall of the load lock chambers 12, 14 and are laterally spaced a distance equal to that of the heads of the lasers 52 such that when the blade 48 is properly aligned, the beams emanating from lasers 52 will be received by the sensors 32. When, however, the blade 48 is tilted slightly (from a horizontal position), one or both of the beams from lasers 52 will not reach the corresponding sensor 32. Likewise, where the heads of the lasers 52 are mounted on the top side of the blade 48, in the event that a wafer 36 is not laying flat on the blade 48, i.e. the wafer 36 is in a tilted orientation, at least part of the wafer 36 blocks the path of one of the laser beams, again preventing at least one of the sensors 32 from receiving and detecting the beam.

From the foregoing, it may be appreciated that the lasers 52 and sensors 32 provide an effective means for sensing when any of at least three conditions are present that could result in an error in the wafer transfer process. The first of these conditions is where the blade 48 is tilted about its longitudinal axis. The second condition consists of the wafer 36 lying in a tilted state on the blade 48. The third condition involves the failure of the robot arm assembly 60 to move the blade 48 to a properly indexed rotational position.

Figure 4:
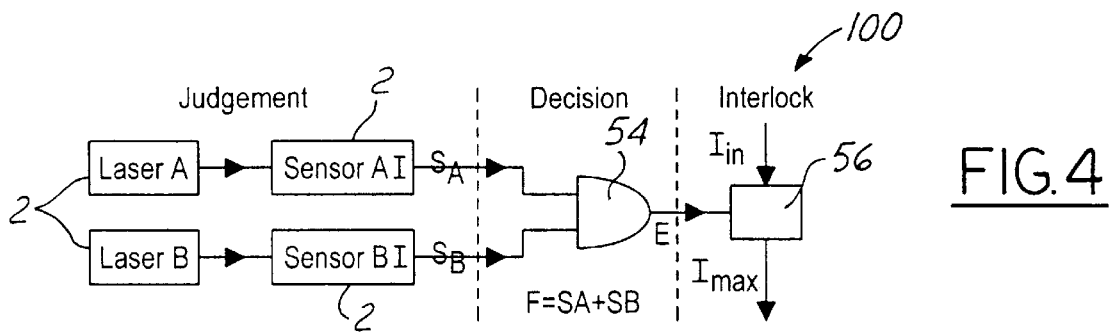
FIG. 4 is a combined block and schematic diagram of the logic circuit which forms part of the controller of the present invention.
Figure 9:
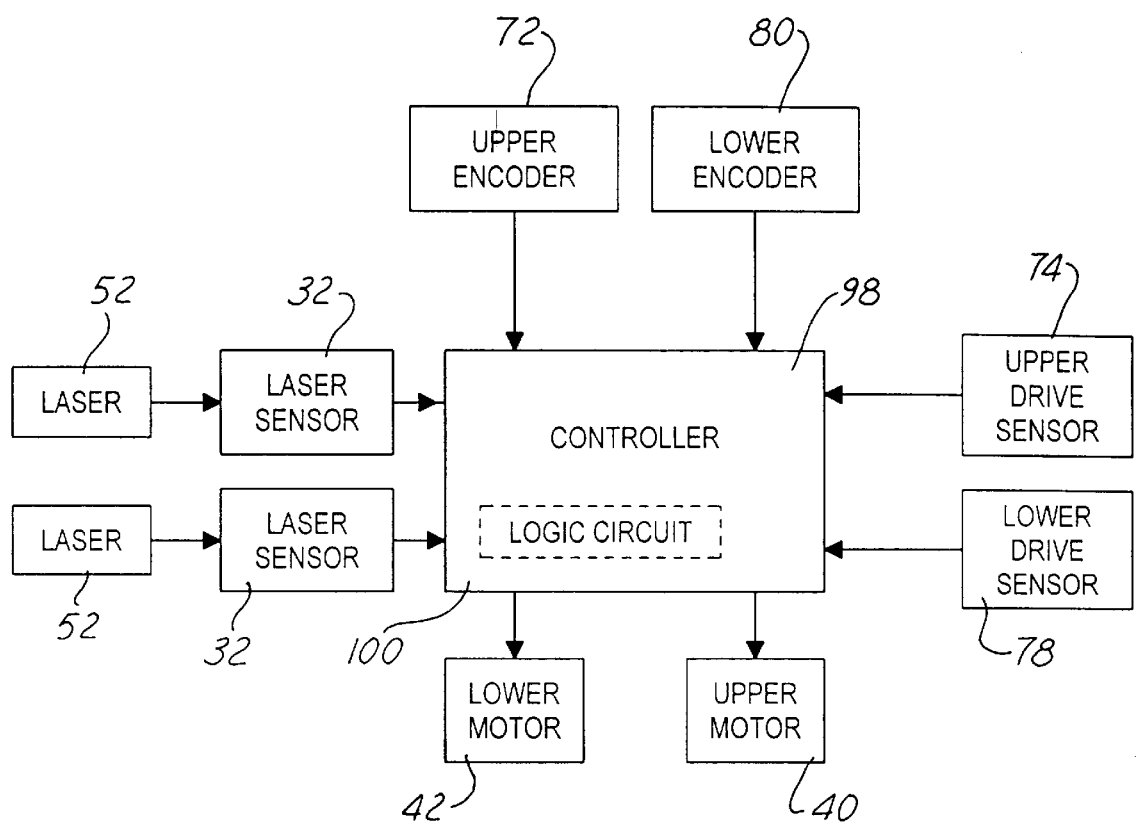

Attention is now directed to FIG. 9 which depicts the control system used in connection with the present invention. The control system includes a controller 98 which may comprise, for example, a commercially available PLC (programmable logic controller) which receives inputs from the laser sensors 32, upper and lower encoders 72, 80 and upper and lower drive sensors 74, 78. The encoders 72, 80 provide the controller 98 with information concerning the precise position of the drive assemblies 62, 64, and particularly the rotational position of the two rings 44. The drive sensors 74, 78 provide the controller 98 with information concerning the position of the drive assembly 62, 64 relative to preselected home positions. Finally, as described above, the laser sensors 32 provide signals to the controller 98 indicative of whether a corresponding laser beam is received from the associated laser 52. The controller 98 includes a logic circuit 100, the details of which are shown in FIG. 4. Sensors 32 output signals which form binary inputs to an AND gate 54 whose output is delivered to an interlock circuit 56 which may comprise a digital switch. When both of the sensor outputs are high, indicating that a laser beam has been sensed, both inputs to AND gate 54 are high, and the latter's output goes high to enable the switch 56. Switch 56 in turn enables the start, or continuation of, the operation of the drive motors 40, 42. When however, either or both of the outputs of sensors 42 goes low, the output of AND gate 54 also goes low causing the switch 56 to open, in turn disabling operation of the motors 40, 42 so that movement of the blade 48 is stopped.

Implementation Examples

Figure 10A:
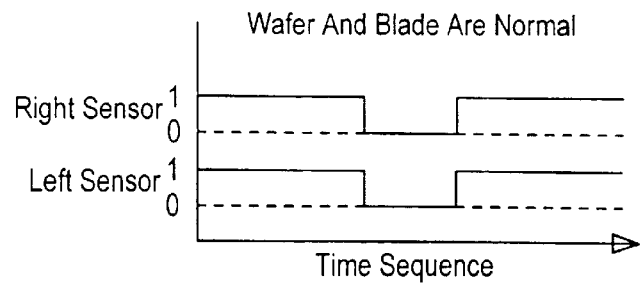
FIGS. 10A–10G are event/time sequence charts for a number of problem events that are detectable by the present invention method.
Figure 10B:
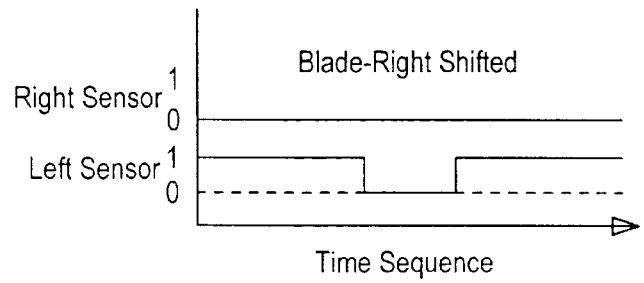

FIGS. 10A–10G illustrate a number of implementation examples of the present invention method event/time sequence charts. For instance, FIG. 10A shows both the right sensor and the left sensor are high, indicating laser beams are sensed when index, wafer and blade function normally. When the blade is slanted, tilted or collide with a chamber part at least one of the sensors does not detect the laser beam and the transfer system is disabled. This is shown in FIG. 10B.

Figure 10C:
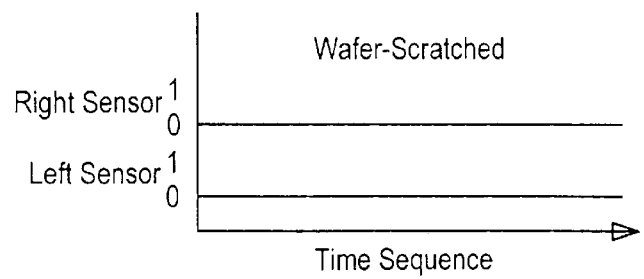
Figure 10D:
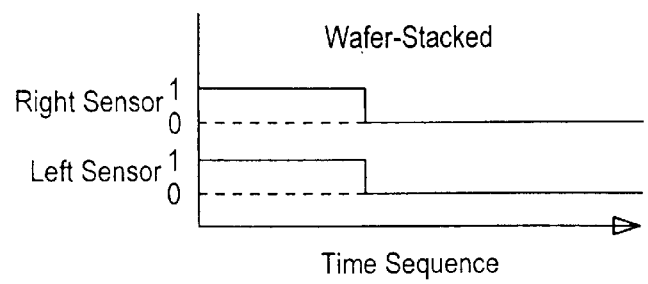

When the blade functions normally except that its position is too high or too low, neither sensor detects the laser beam such that the transfer system is disabled to prevent the blade from colliding with or scratching the wafer. The event/time sequence chart for such occurrence is shown in FIG. 10C. Similarly, when the blade functions normally but two wafers are stacked together in a single slot in the cassette, the sensors do not detect the laser beams, as shown in FIG. 10D, so that the transfer system is also disabled. This occurs, for example, when there is residual photoresist material left on the surface of one of the wafers that are stacked together, or when the wafer is not properly positioned on the wafer blade.

Figure 10E:
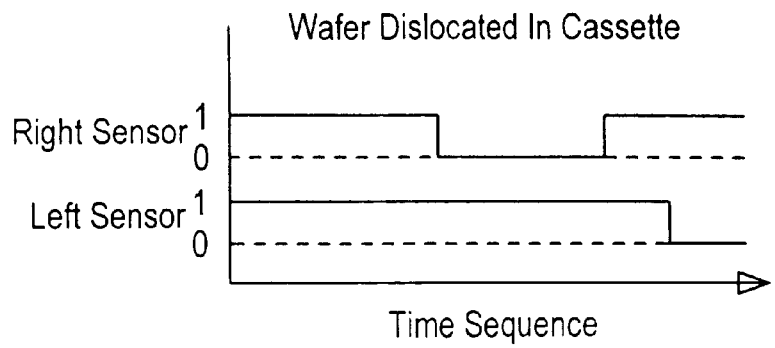
Figure 10F:
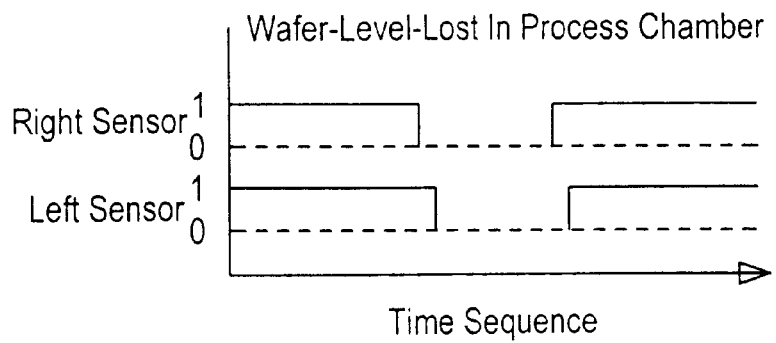
Figure 10G:
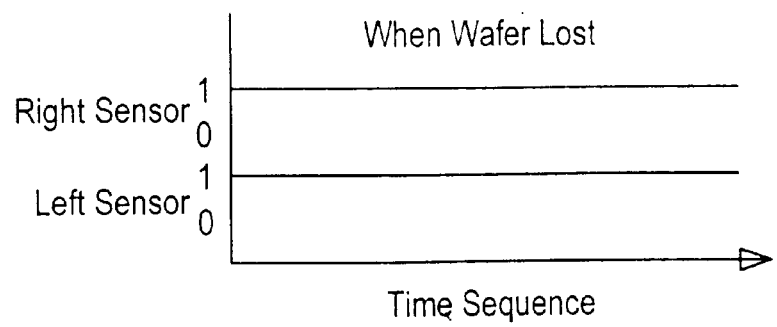

FIG. 10E illustrates an occurrence wherein a blade is used to pick up a wafer that is dislocated in the wafer cassette or the chamber lifter is tilted, i.e., an opposite side of the wafer is placed in a higher or lower slot. The two sensor signals detected are inconsistent in timing so that the wafer transfer is disabled. In still another occurrence, a wafer is not placed in a horizontal position, i.e., not leveled, in a process chamber, the two sensor signals detected are inconsistent in timing such that the wafer transfer is disabled. This is shown in FIG. 10F. In the last occurrence shown in FIG. 10G, the wafer is lost in the process chamber or the cassette, the cassette indexer, the chamber lifter functions improperly so that the presence of wafer is not detected. This occurs when a wafer is dropped to the bottom of the chamber.

From the foregoing, it may be appreciated that the present invention not only provides for the reliable accomplishment of the objects of the objects of the invention, but it does so in a particularly economical and efficient manner. It is recognized, of course, that those skilled in the art may make various modifications or additions to the preferred embodiment chosen to illustrate the invention without departing from the present contribution to the art. Accordingly, it is to be understood that the protection sought and to be afforded hereby should be deemed to extend to the subject matter claimed and all equivalents thereof fairly within the scope of the invention.

I claim:

1. A method of controlling the operation of a semiconductor wafer transfer system of the type having a blade upon which a wafer is carried, and a robotic arm for transferring said blade between a plurality of chambers in a semiconductor processing system, comprising the steps of:

rotating said arm between each of a plurality of indexed positions respectively corresponding to said chambers;

shifting said arm between an extended, wafer transferring position, and a retracted, home position;

sensing by at least two laser beams and at least two receivers when said wafer is not in a preselected, desired position on said blade; and, inhibiting rotation and shifting of said arm when the position of said wafer sensed in said sensing step is not said preselected position.

2. The method of claim 1 further comprising the step of generating an error signal when said wafer is not in said preselected position thereof, and using said error signal to interrupt the rotation and movement of said arm.

3. The method of claim 1, wherein said sensing step is performed by directing a pair of laser beams across and in close proximity to the surface of said wafer, receiving at a receiver each of said laser beams after said beams have traversed across said wafer surface, and creating an error signal when either of said beams is blocked by said wafer such that the blocked beam is not received by said receiver.

4. The method of claim 1, wherein said sensing step is performed by detecting when said wafer is tilted from a normal, horizontal position in reference to said blade.

5. The method of claim 1, wherein said sensing step is performed by detecting when said blade is out of a normal aligned position relative to one of said chambers.

6. The method of claim 1, wherein said sensing step is performed by detecting the absence of a wafer pedestal in a process chamber.

7. The method of claim 1, wherein said sensing step is performed by detecting that two wafers are stuck together and positioned in a wafer cassette.

8. The method of claim 1, wherein said sensing step is performed by detecting that the blade is positioned either too high or too low for picking up a wafer.

9. The method of claim 1, wherein:

said sensing step is performed by producing a first signal related to the detection of said wafer tilt, and producing a second signal related to the detection of said blade position, and said step of inhibiting rotation includes comparing each of said first and second signals with a pre-selected desired logic state.

10. The method of claim 9, wherein said step of inhibiting rotation includes issuing an error signal inhibiting the rotation and shifting of said arm unless both of said first and second signals match said pre-selected, desired logic state.

11. A method of transferring wafer by a robot blade of the type having a blade upon which a wafer is carried, and a robot arm for transferring said blade between a plurality of chambers in a cluster, comprising the steps of:

rotating said robot arm between each of a plurality of indexed positions respectively corresponding to said chambers;

shifting said robot arm between an extended, wafer transferring position, and a retracted, home position;

sensing by a plurality of laser beams and a plurality of laser receivers when said wafer is not in a preselected, desired position on said robot blade, said plurality of laser beams comprises two laser beams mounted on top of said robot blade and a laser beam mounted on the bottom of said robot blade; and, inhibiting rotation and shifting of said robot arm when the position of said wafer sensed is not said preselected position.

12. The method of claim 11, including the step of generating an error signal when said wafer is not in said preselected position thereof, and using said error signal to interrupt the rotation and movement of said arm.

13. The method of claim 11, wherein said step of sensing is performed by directing a pair of laser beams across and in close proximity to a top surface of said wafer, directing a laser beam across and in close proximity to a bottom surface of said wafer receiving at a receiver each of said laser beams after said beams have traversed across said top and bottom wafer surfaces, and creating an error signal when either of said beams is blocked by said wafer such that the blocked beam is not received by said receiver.

14. The method of claim 11, wherein said step of sensing is performed by detecting when said wafer is tilted away from a normal, horizontal position on said blade.

15. The method of claim 11, wherein said step of sensing is performed by detecting when said blade is out of a normal aligned position relative to one of said chambers.

16. The method of claim 11, wherein:

said sensing step is performed by producing a first signal related to the detection of said wafer tilt, and producing a second signal related to the detection of said blade position, and said step of inhibiting rotation includes comparing each of said first and second signals with a pre-selected desired logic state.

17. The method of claim 16, wherein said step of inhibiting rotation includes issuing an error signal inhibiting the rotation and shifting of said arm unless both of said first and second signals match said pre-selected, desired logic state.

18. The method of claim 11, wherein said sensing step is performed by detecting the absence of a wafer pedestal in a process chamber.

19. The method of claim 11, wherein said sensing step is performed by detecting that two wafers are stuck together and positioned in a wafer cassette.

20. The method of claim 11, wherein said sensing step is performed by detecting that the blade is positioned either too high or too low for picking up a wafer.

* * * * *